United States Patent
Camacho et al.

(10) Patent No.: US 8,502,357 B2
(45) Date of Patent: Aug. 6, 2013

(54) INTEGRATED CIRCUIT PACKAGING SYSTEM WITH SHAPED LEAD AND METHOD OF MANUFACTURE THEREOF

(75) Inventors: Zigmund Ramirez Camacho, Singapore (SG); Emmanuel Espiritu, Singapore (SG); Henry Descalzo Bathan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 206 days.

(21) Appl. No.: 12/856,288

(22) Filed: Aug. 13, 2010

(65) Prior Publication Data

US 2011/0079885 A1 Apr. 7, 2011

Related U.S. Application Data

(60) Provisional application No. 61/247,565, filed on Oct. 1, 2009.

(51) Int. Cl.
*H01L 29/00* (2006.01)
(52) U.S. Cl.
USPC .................. 257/666; 257/676; 257/E23.046
(58) Field of Classification Search
USPC .................................. 257/666, 676, E23.046
See application file for complete search history.

(56) References Cited

U.S. PATENT DOCUMENTS

| | | | |
|---|---|---|---|
| 5,466,966 A * | 11/1995 | Ito | ................................ 257/666 |
| 6,001,671 A | 12/1999 | Fjelstad | |
| 6,261,864 B1 | 7/2001 | Jung et al. | |
| 7,049,177 B1 | 5/2006 | Fan et al. | |
| 7,622,332 B2 | 11/2009 | Islam et al. | |
| 7,790,500 B2 | 9/2010 | Ramos et al. | |
| 7,799,611 B2 | 9/2010 | Ramos et al. | |
| 8,106,492 B2 | 1/2012 | Chang Chien et al. | |
| 8,115,285 B2 | 2/2012 | Chen et al. | |
| 8,124,447 B2 | 2/2012 | Chang Chien et al. | |
| 8,318,287 B1 | 11/2012 | Glenn | |
| 2003/0015780 A1 | 1/2003 | Kang et al. | |
| 2004/0175864 A1 | 9/2004 | Mahle | |
| 2008/0258278 A1 | 10/2008 | Ramos et al. | |

OTHER PUBLICATIONS

U.S. Appl. No. 12/822,877, filed Jun. 24, 2010, Do et al.

* cited by examiner

*Primary Examiner* — Howard Weiss
*Assistant Examiner* — Steven Rao
(74) *Attorney, Agent, or Firm* — Ishimaru & Associates LLP; I-Chang John Yang

(57) ABSTRACT

A method of manufacture of an integrated circuit packaging system includes: forming a package lead having a retention structure around a perimeter of the package lead with a first concave surface, a ridge, and a second concave surface; forming a die attach paddle adjacent the package lead and having an another retention structure around a perimeter of the die attach paddle with an another first concave surface, an another ridge, and an another second concave surface; attaching an integrated circuit die to the die attach paddle; connecting a conductive connector to the integrated circuit die and the package lead; and applying an encapsulation over the integrated circuit die, the encapsulation conformed to the retention structure and exposing a portion of the package lead.

16 Claims, 5 Drawing Sheets

INTEGRATED CIRCUIT PACKAGING SYSTEM WITH SHAPED LEAD AND METHOD OF MANUFACTURE THEREOF

CROSS-REFERENCE TO RELATED APPLICATION(S)

This application claims the benefit of U.S. Provisional Patent Application Ser. No. 61/247,565 filed Oct. 1, 2009, and the subject matter thereof is incorporated herein by reference thereto.

TECHNICAL FIELD

The present invention relates generally to an integrated circuit packaging system, and more particularly to a system for leads.

BACKGROUND ART

Semiconductor chips have become progressively more complex, driven in large part by the need for increasing processing power in a smaller chip size for compact or portable electronic devices such as cell phones, smart phones, personal media systems, ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections.

In general, the die and portions of the leadframe are encapsulated with a molding material to protect the delicate electrical components on the active side of the die while leaving selected portions of the leadframe exposed to facilitate electrical connection to external devices.

In response to the smaller chip size, packaging technologies have evolved, for example, to enable an increased lead density, which can reduce the footprint area of a package mounted on a printed circuit board (PCB). Some packaging technologies may enable this increased lead density by providing rows of leads connected to a disposable portion of a leadframe.

However, manufacturing processes for such leadframes may not be scalable. As lead density requirements further increase, it may be desirable to use packaging technologies that are more scalable in terms of lead density.

Moreover, it may be desirable to reduce package size and package costs in additional ways. At the same time, it may be desirable to maintain sufficient structural integrity and to facilitate surface mounting of the package to a PCB. It may also be desirable to formulate a packaging process designed to meet these objectives while providing increases in package reliability and reductions in packaging defects. Current packaging solutions can meet some of these objectives but may not be able to meet most, or all, of these objectives.

Thus, a need remains for increased density and structural integrity. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a package lead having a retention structure around a perimeter of the package lead with a first concave surface, a ridge, and a second concave surface; forming a die attach paddle adjacent the package lead and having an another retention structure around a perimeter of the die attach paddle with an another first concave surface, an another ridge, and an another second concave surface; attaching an integrated circuit die to the die attach paddle; connecting a conductive connector to the integrated circuit die and the package lead; and applying an encapsulation over the integrated circuit die, the encapsulation conformed to the retention structure and exposing a portion of the package lead.

The present invention provides an integrated circuit packaging system, including: a package lead having a retention structure around a perimeter of the package lead with a first concave surface, a ridge, and a second concave surface; a die attach paddle adjacent the package lead and having an another retention structure around a perimeter of the die attach paddle with an another first concave surface, an another ridge, and an another second concave surface; an integrated circuit die attached to the die attach paddle; a conductive connector connected to the integrated circuit die and the package lead; and an encapsulation over the integrated circuit die and conformal to the retention structure, a portion of the package lead exposed from the encapsulation.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
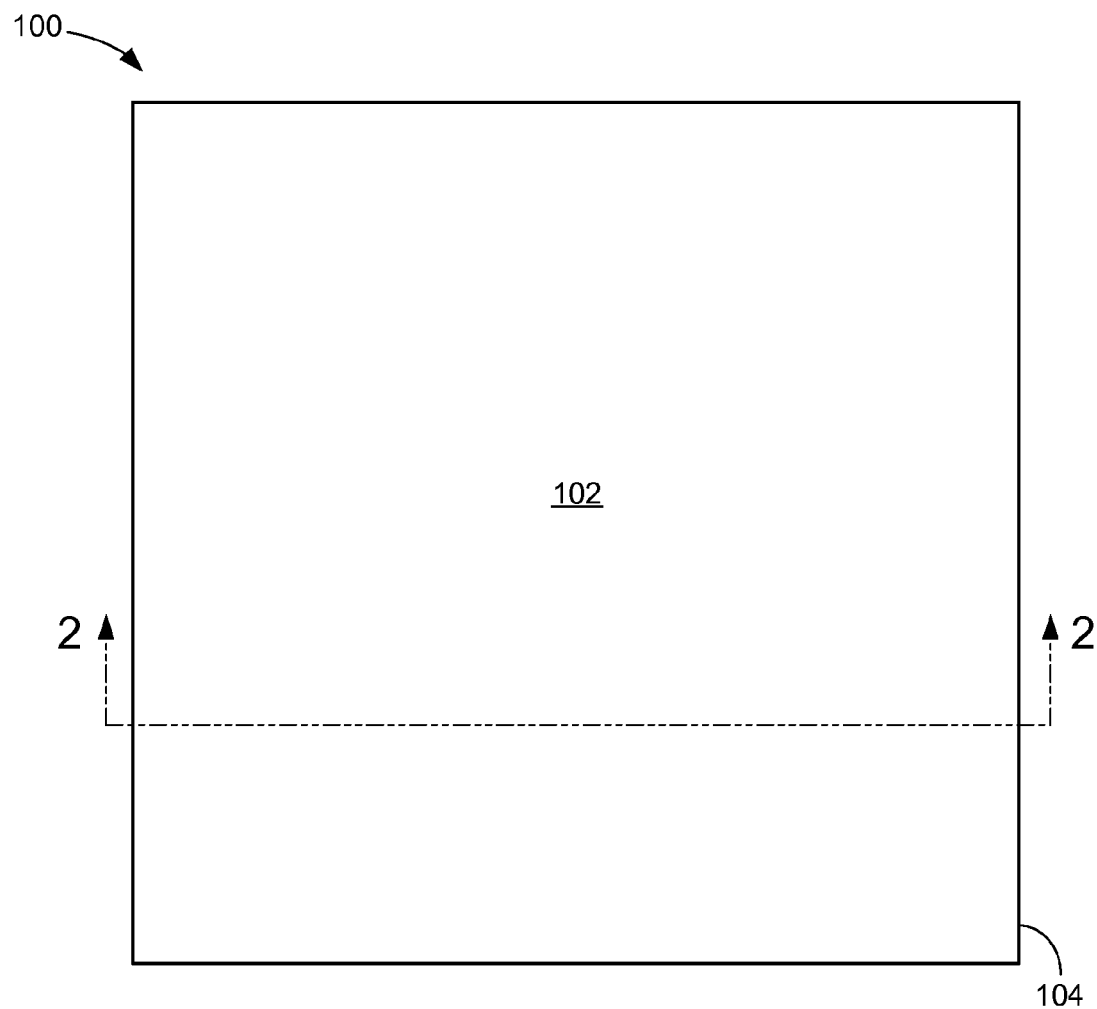
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 is shown with an encapsulation 102 with encapsulation sides 104. The encapsulation 102 is used to protect the integrated circuit packaging system 100 by providing structural support and to hermetically seal the contents of the integrated circuit packaging system 100.

Figure 2:
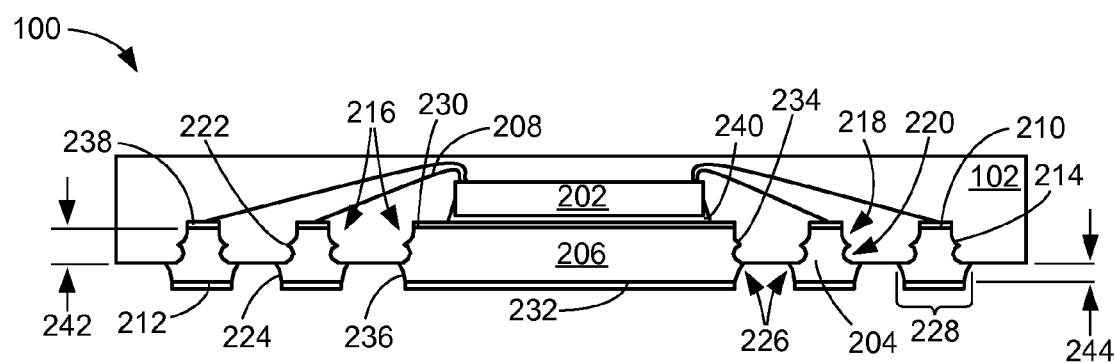
FIG. 2 is a cross-sectional view of FIG. 1 taken along a line 2-2 of FIG. 1.

Referring now to FIG. 2, therein is shown a cross-sectional view of FIG. 1 taken along a line 2-2 of FIG. 1. The integrated circuit packaging system 100 includes an integrated circuit die 202, package leads 204, a die attach paddle 206, conductive connectors 208, and the encapsulation 102.

The package leads 204 and the die attach paddle 206 can be formed of a conductive material such as copper, aluminum, or other material that includes conductive elements. The package leads 204 and the die attach paddle 206 can be used to provide connectivity between the present invention and a next level of integration. For illustrative purposes, two rows of the package leads 204 are shown although it is understood that any number of rows may be used.

Each of the package leads 204 are formed having an inward end 210 and an outward end 212 opposite the inward end 210. Inward sides 214 along a length of the package leads 204 closest to, intersecting, and surrounding the inward end 210, include a retention structure 216 used to prevent pullout or any movement of the package leads 204.

The retention structure 216 of the inward sides 214 around a perimeter of each of the package leads 204 includes a first concave surface 218 and a second concave surface 220. The first concave surface 218 and the second concave surface 220 are each defined as a surface depression formed along a width of each of the inward sides 214 and perpendicular to the length of the package leads 204

The first concave surface 218 and the second concave surface 220 are separated from one another by a ridge 222 protruding horizontally from the package leads 204. The ridge 222 forms a perimeter around a cross-sectional width of the package leads 204. The ridge 222 extends above the first concave surface 218 and the second concave surface 220. The first concave surface 218 intersects the inward end 210.

Outward sides 224 along the length of the package leads 204 are formed between the inward sides 214 and the outward end 212. An end of the outward sides 224 intersect the outward end 212 and an end of the outward sides 224 furthest from the outward end 212 intersects the inward sides 214 to form each of the package leads 204.

The end of the outward sides 224 intersecting the inward sides 214 can include a flared shaped region 226 curved horizontally away from the package leads 204. The flared shaped region 226 can extend above the retention structure 216 on each of the inward sides 214 of the package leads 204.

The flared shaped region 226 is formed having a body cross-sectional area 228 greater than any other horizontal cross-section of the package leads 204. The body cross-sectional area 228 is defined as an area of a cross-sectional located in a horizontal plane intersecting the flared shaped region 226. The horizontal cross-section is defined as an area of a cross-section located in a horizontal plane intersecting the package leads 204.

The die attach paddle 206 can be formed having a first end 230, a second end 232, upper sides 234, and lower sides 236 in a manner identical to the inward end 210, the outward end 212, the inward sides 214, and the outward sides 224 of the package leads 204, respectively. The upper sides 234 and the lower sides 236, can include the retention structure 216 and the flared shaped region 226, respectively.

The inward end 210 and the outward end 212 of each of the package leads 204 can be covered with a conductive plating 238 to provide improved connective characteristics of the package leads 204. The conductive plating 238 can be directly on or over opposite ends of the package leads 204 including the inward end 210 and the outward end 212. The first end 230 and the second end 232 of the die attach paddle 206 can be covered with the conductive plating 238 in a manner identical to the inward end 210 and the outward end 212, respectively.

The integrated circuit die 202 can be mounted over the die attach paddle 206 and electrically connected to the conductive plating 238 over the package leads 204 using the conductive connectors 208. The integrated circuit die 202 can be attached to the die attach paddle 206 using an attachment layer 240.

The encapsulation 102 covers and surrounds the conductive connectors 208, the integrated circuit die 202, the inward sides 214, and the upper sides 234. The encapsulation 102 adheres to the inward sides 214 and the upper sides 234 in a conformal manner.

Lead pull out is common in conventional stand-off quad flat nolead sawn (QFNs-st) designs as lead pull strength is weak for conventional stand-off QFN. It is one of the few remaining reasons why stand-off quad flat nolead (QFN-st) has not completely replaced ball grid array (BGA) and other conventional quad flat pack (QFP).

It has been discovered that the retention structure 216 with the first concave surface 218, the second concave surface 220, and the ridge 222, enables the encapsulation 102 to hold, restrain, and prevent any movement or lead pull of the package leads 204.

The outward sides 224, the lower sides 236, and the conductive plating 238 over the outward sides 224 and the lower sides 236, are exposed from the encapsulation 102. The encapsulation 102 conforms and attaches to an end of the flared shaped region 226 of each of the outward sides 224 and to each of the lower sides 236 intersecting the inward sides 214 and the upper sides 234, respectively.

An encapsulated lead length 242 is defined as a vertical length of a portion of the package leads 204 enclosed by the encapsulation 102. An exposed lead length 244 is defined as a vertical length of a portion of the package leads 204 exposed from the encapsulation 102. The encapsulated lead length 242 is more than twice the exposed lead length 244.

It has been discovered that the flared shaped region 226 improves the hermetic sealing characteristics of the integrated circuit packaging system 100 by eliminating any occurrence of contaminate entry between the inward sides 214 and the encapsulation 102.

It has also been discovered that the flared shaped region 226 provides additional structural rigidity to prevent portions of the package leads 204 exposed from the encapsulation 102 from bending during handling or assembly of the integrated circuit packaging system 100. The present invention can be implemented in many packaging systems and that can include quad flat nolead sawn stand-off multiple row packages (QFNs-st-mr)

Figure 3:
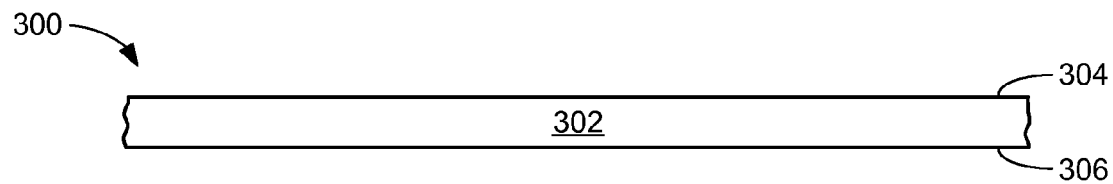
FIG. 3 is a cross-sectional view of an integrated circuit packaging system in a second embodiment of the present invention in a material process phase.

Referring now to FIG. 3, therein is shown a cross-sectional view of an integrated circuit packaging system 300 in a second embodiment of the present invention in a material process phase. The material process phase can include providing a conductive panel 302 and cleaning, positioning process, or forming the conductive panel 302.

Shown is a portion of the conductive panel 302 that can be formed of a copper conductive material. The conductive panel 302 includes an assembly side 304 and a base side 306 opposite the assembly side 304.

Figure 4:
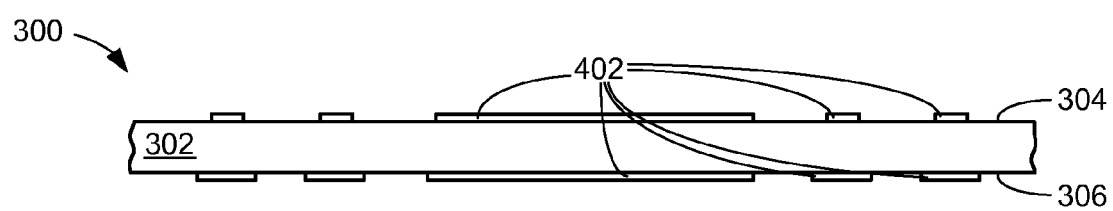
FIG. 4 is the structure of FIG. 3 in a plating phase.

Referring now to FIG. 4, therein is shown the structure of FIG. 3 in a plating phase. The plating phase can include selective plating with a plating 402 over the conductive panel 302 for a preplated frame, a preplated leadframe, a preplated leadframe finish, or preplated leadframe finishes, sometimes referred to as PPF.

The plating 402 can be applied to the assembly side 304 and the base side 306. The plating 402 can be applied with a spatial orientation relative to the conductive panel 302 in a manner similar to a spatial orientation of the conductive plating 238 of FIG. 2 relative to the package leads 204 of FIG. 2 and the die attach paddle 206 of FIG. 2.

It is understood that the plating 402 can be applied having other spatial orientations. As an example, the plating 402 shown to the left of a vertical center of the conductive panel 302 could be omitted in a different embodiment of the present invention.

Figure 5:
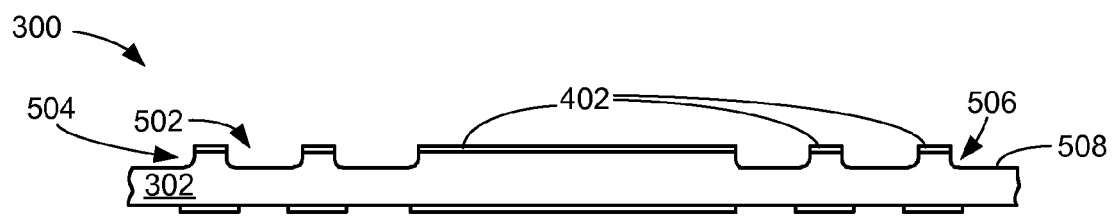
FIG. 5 is the structure of FIG. 4 in a first removal phase.

Referring now to FIG. 5, therein is shown the structure of FIG. 4 in a first removal phase. The first removal phase can include removal of a portion of the conductive panel 302 preferably between the plating 402 over the assembly side 304 of FIG. 4 using a material removal process. The material removal process can include an etching process or any other removal process. The etching process can include a first etching, a partial etching, or a half etching.

First elongated cavities 502 can be formed in the conductive panel 302 during the first removal phase. The first elongated cavities 502 are formed by a first curved surface 504 having first curved end 506 intersecting a first elongated base surface 508 of the conductive panel 302. Multiple iterations of the first removal process can result in an isotropic removal of material to form the first elongated cavities 502 in the conductive panel 302.

Figure 6:
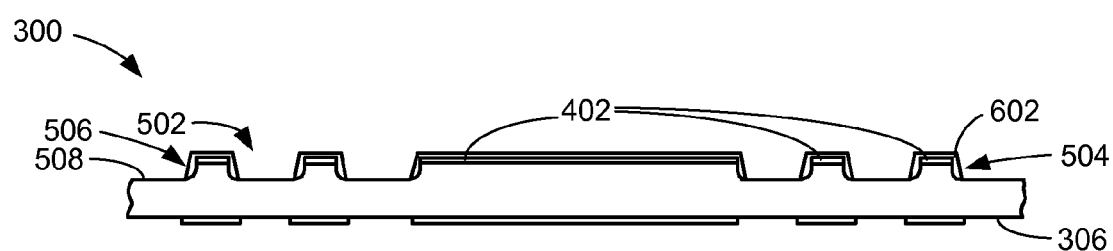
FIG. 6 is the structure of FIG. 5 in a masking phase.

Referring now to FIG. 6, therein is shown the structure of FIG. 5 in a masking phase. The masking phase can include a mask layer 602 applied around the first elongated base surface 508 and over the plating 402 facing away from the base side 306, the first curved surface 504, and the first curved end 506.

The first elongated base surface 508 is exposed from the mask layer 602. The mask layer 602 can include a mask material used to inhibit removal of any material covered by the mask layer 602.

Figure 7:
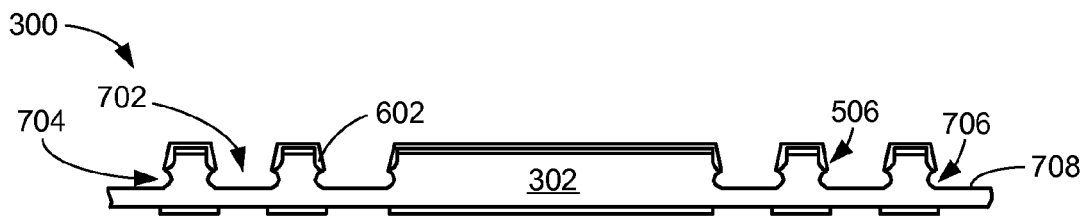
FIG. 7 is the structure of FIG. 6 in a second removal phase.

Referring now to FIG. 7, therein is shown the structure of FIG. 6 in a second removal phase. The second removal phase can include removal of the first elongated base surface 508 of FIG. 5 and a portion of the conductive panel 302 around the mask layer 602 to form second elongated cavities 702 in the first elongated cavities 502. The second elongated cavities 702 can be formed in the conductive panel 302 through the first elongated base surface 508 and under the first elongated cavities 502 using the material removal process.

The second elongated cavities 702 are formed by a second curved surface 704 having a second curved end 706 intersecting a second elongated base surface 708 of the conductive panel 302. The second elongated cavities 702 can be similar to the first elongated cavities 502. Multiple iterations of the second removal process can result in an isotropic removal of material to form the second elongated cavities 702 in the conductive panel 302.

Figure 8:
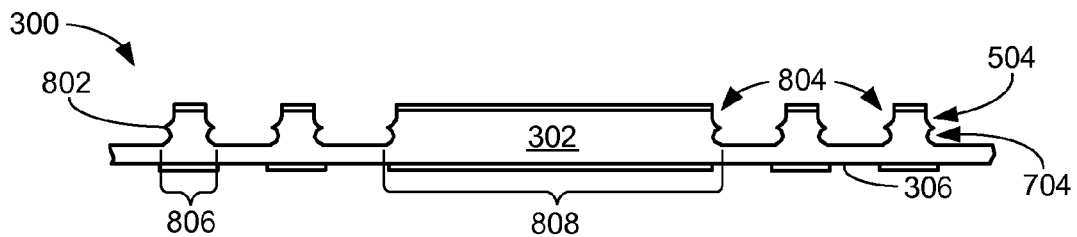
FIG. 8 is the structure of FIG. 7 in a mask removal phase.

Referring now to FIG. 8, therein is shown the structure of FIG. 7 in a mask removal phase. A mask removal process can be used to remove the mask layer 602 of FIG. 7 during the mask removal phase. The mask removal process can include cleaning a photoresist, washing a mask layer, or chemically removing a mask material to expose a protrusion 802 separating the second curved surface 704 from the first curved surface 504.

The protrusion 802 with the first curved surface 504, and the second curved surface 704 forms an interlock structure 804 on sides of base structures 806 and sides of a central structure 808 extending horizontally away from a side of the conductive panel 302 opposite the base side 306. The interlock structure 804 is formed in a manner identical to the retention structure 216 of FIG. 2.

Figure 9:
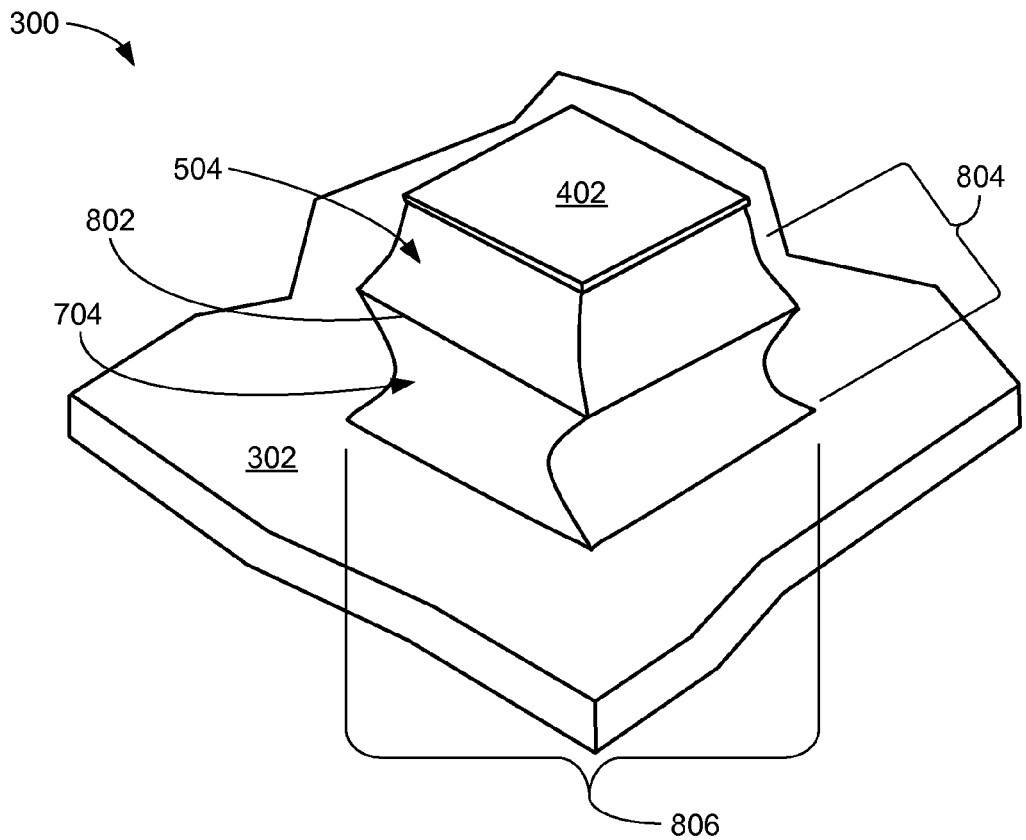
FIG. 9 is an isometric view of a portion of the structure of FIG. 8.

Referring now to FIG. 9, therein is shown an isometric view of a portion of the structure of FIG. 8. The isometric view depicts details of one of the base structures 806 and a portion of the conductive panel 302. The base structures 806 are formed in a manner identical to portions of the package leads 204 of FIG. 2 enclosed and in direct contact with the encapsulation 102 of FIG. 2.

The protrusion 802 is shown separating the first curved surface 504 from the second curved surface 704. The protrusion 802 forms a perimeter around a cross-sectional width of the base structures 806. The interlock structure 804 is formed on each of the sides of the interlock structure 804 that intersect the plating 402.

Figure 10:
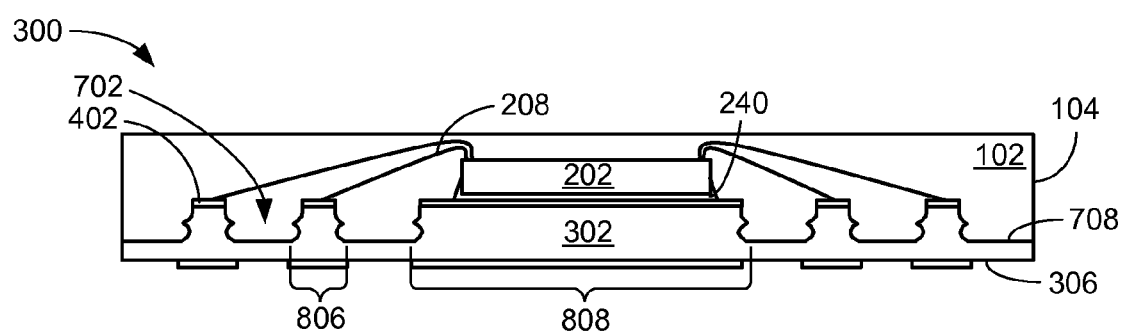
FIG. 10 is the structure of FIG. 8 in an integration phase.

Referring now to FIG. 10, therein is shown the structure of FIG. 8 in an integration phase. The integrated circuit die 202 can be mounted over the central structure 808 of the conductive panel 302 on the side opposite the base side 306 with the attachment layer 240 using a mounting process. The conductive connectors 208 can be attached to circuitry of the integrated circuit die 202 and the plating 402 of the base structures 806 using a connection process.

The second elongated base surface 708, the base structures 806, the central structure 808, the plating 402, the conductive connectors 208, and the integrated circuit die 202 can be covered with the encapsulation 102 during the integration phase using an encapsulating process. The encapsulation 102 fills the second elongated cavities 702 and conformally adhering to all surfaces of each of the base structures 806 and of the central structure 808.

The base side 306 and the plating 402 of the base side 306 are exposed from the encapsulation 102. A portion of ends of the conductive panel 302 and non-horizontal sides of the encapsulation 102 can be removed to improve structural appearance using a sawing, grinding, polishing, planarization, or other material removal method, to form the encapsulation sides 104.

Figure 11:
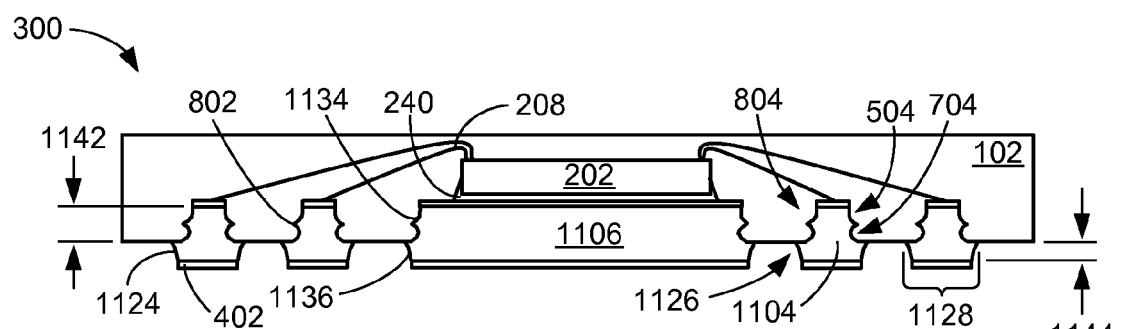
FIG. 11 is the structure of FIG. 8 in a base removal phase.

Referring now to FIG. 11, therein is shown the structure of FIG. 8 in a base removal phase. The base removal phase can include removal of a portion of the conductive panel 302 of FIG. 10 preferably between the plating 402 of the base side 306 of FIG. 10 using the material removal process.

The removal of the portion of the conductive panel 302 results in the formation of the integrated circuit packaging system 300 identical to the integrated circuit packaging system 100 of FIG. 2. The integrated circuit packaging system 300 includes leads 1104, a paddle platform 1106, the integrated circuit die 202, the attachment layer 240, the encapsulation 102, the conductive connectors 208, and the plating 402.

The leads 1104 and the paddle platform 1106 can be identical to the package leads 204 of FIG. 2 and the die attach paddle 206 of FIG. 2, respectively. The leads 1104 with the interlock structure 804 having the first curved surface 504, the second curved surface 704, and the protrusion 802 can be identical to the retention structure 216 of FIG. 2 having the first concave surface 218 of FIG. 2, the second concave surface 220 of FIG. 2, and the ridge 222 of FIG. 2, respectively.

The plating 402 and the leads 1104 have exposed sides 1124 with a flared shaped region 1126 that can be identical to the conductive plating 238 of FIG. 2 and the package leads 204 with the outward sides 224 of FIG. 2 having the flared shaped region 226 of FIG. 2, respectively. The paddle platform 1106 having a first paddle side 1134 and a second paddle side 1136 can be identical to the die attach paddle 206 of FIG. 2 having the upper sides 234 of FIG. 2 and the lower sides 236 of FIG. 2, respectively.

The flared shaped region 1126 is formed having a body cross-sectional area 1128 greater than any other horizontal cross-section of the leads 1104. The body cross-sectional area 1128 is defined as an area of a cross-sectional located in a horizontal plane intersecting the flared shaped region 1126. The horizontal cross-section is defined as an area of a cross-section located in a horizontal plane intersecting the leads 1104

An encapsulated lead length 1142 is defined as a vertical length of a portion of the leads 1104 enclosed by the encapsulation 102. An exposed lead length 1144 is defined as a vertical length of a portion of the leads 1104 exposed from the encapsulation 102. The encapsulated lead length 1142 can be more than twice the exposed lead length 1144.

Figure 12:
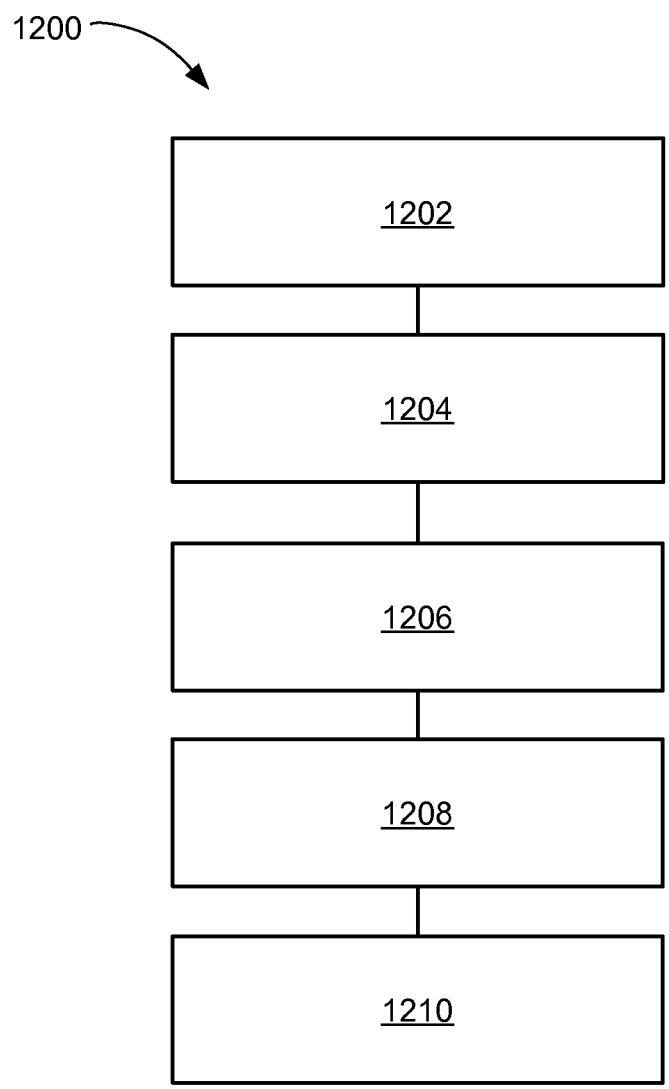
FIG. 12 is a flow chart of a method of manufacture of the integrated circuit packaging system in a further embodiment of the present invention.

Referring now to FIG. 12, therein is shown a flow chart of a method 1200 of manufacture of the integrated circuit packaging system 100 in a further embodiment of the present invention. The method 1200 includes: forming a package lead having a retention structure around a perimeter of the package lead with a first concave surface, a ridge, and a second concave surface in a block 1202; forming a die attach paddle adjacent the package lead and having an another retention structure around a perimeter of the die attach paddle with an another first concave surface, an another ridge, and an another second concave surface in a block 1204; attaching an integrated circuit die to the die attach paddle in a block 1206; connecting a conductive connector to the integrated circuit die and the package lead in a block 1208; and applying an encapsulation over the integrated circuit die, the encapsulation conformed to the retention structure and exposing a portion of the package lead in a block 1210.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a package lead having:
        a first retention structure around a perimeter of the package lead with a first concave surface, a first ridge, and a second concave surface, wherein the second concave surface is separated from the first concave surface by the first ridge; and
        a first flared shaped region and a third concave surface, wherein the third concave surface is separated from the second concave surface by the first flared shaped region, the first flared shaped region having a body cross-sectional area greater than any other horizontal cross-section of the package lead;
    forming a die attach paddle adjacent the package lead, the die attach paddle having:
        a second retention structure around a perimeter of the die attach paddle having a fourth concave surface, a second ridge, and a fifth concave surface, wherein the fifth concave surface is separated from the fourth concave surface by the second ridge; and
        a second flared shaped region and a sixth concave surface, wherein the sixth concave surface is separated from the fifth concave surface by the second flared shaped region, the second flared shaped region having a body cross-sectional area greater than any other horizontal cross-section of the die attach paddle;

attaching an integrated circuit die to the die attach paddle;

connecting a conductive connector to the integrated circuit die and the package lead; and applying an encapsulation over the integrated circuit die, the encapsulation conforming to the first retention structure and exposing a portion of the package lead.

2. The method as claimed in claim 1 wherein applying the encapsulation includes exposing the first flared shaped region of the package lead.

3. The method as claimed in claim 1 wherein forming the package lead includes forming the package lead with an encapsulated lead length greater than twice an exposed lead length.

4. The method as claimed in claim 1 further comprising applying a conductive plating over opposite ends of the package lead.

5. A method of manufacture of an integrated circuit packaging system comprising:

forming a package lead having:
a first retention structure around a perimeter of the package lead with a first concave surface, a first ridge, and a second concave surface, wherein the second concave surface is separated from the first concave surface by the first ridge; and
a first flared shaped region and a third concave surface, wherein the third concave surface is separated from the second concave surface by the first flared shaped region, the first flared shaped region having a body cross-sectional area greater than any other horizontal cross-section of the package lead;

forming a die attach paddle adjacent the package lead, the die attach paddle having:
a second retention structure around a perimeter of the die attach paddle having a fourth concave surface, a second ridge, and a fifth concave surface, wherein the fifth concave surface is separated from the fourth concave surface by the second ridge; and
a second flared shaped region and a sixth concave surface, wherein the sixth concave surface is separated from the fifth concave surface by the second flared shaped region, the second flared shaped region having a body cross-sectional area greater than any other horizontal cross-section of the die attach paddle;

attaching an integrated circuit die to the die attach paddle;

connecting a conductive connector to the integrated circuit die and the package lead; and applying an encapsulation over the integrated circuit die, the encapsulation conforming to the first retention structure and the second retention structure, and exposing a portion of the package lead and of the die attach paddle, 6. The method as claimed in claim 5 wherein applying the encapsulation includes exposing the second flared shaped region of the die attach paddle.

7. The method as claimed in claim 5 wherein forming the die attach paddle includes forming the die attach paddle with an encapsulated lead length greater than twice an exposed lead length.

8. The method as claimed in claim 5 further comprising applying a conductive plating over opposite ends of the die attach paddle.

9. An integrated circuit packaging system comprising:
a package lead having:
a first retention structure around a perimeter of the package lead, the first retention structure with a first concave surface, a first ridge, and a second concave surface, the second concave surface separated from the first concave surface by the first ridge;
a first flared shaped region and a third concave surface, wherein the third concave surface is separated from the second concave surface by the first flared shaped region, the first flared shaped region having a body cross-sectional area greater than any other horizontal cross-section of the package lead;
a die attach paddle adjacent the package lead and having:
a second retention structure around a perimeter of the die attach paddle with a fourth concave surface, a second ridge, and a fifth concave surface, wherein the fifth concave surface is separated from the four concave surface by the second ridge; and
a second flared shaped region and a sixth concave surface, wherein the sixth concave surface is separated from the fifth concave surface by the second flared shaped region, the second flared shaped region having a body cross-sectional area greater than any other horizontal cross-section of the die attach paddle;
an integrated circuit die attached to the die attach paddle;
a conductive connector connected to the integrated circuit die and the package lead; and
an encapsulation over the integrated circuit die and conformal to the first retention structure, a portion of the package lead exposed from the encapsulation.

10. The system as claimed in claim 9 wherein the encapsulation exposes the first flared shaped region of the package lead.

11. The system as claimed in claim 9 wherein the package lead includes the package lead with an encapsulated lead length greater than twice an exposed lead length.

12. The system as claimed in claim 9 further comprising a conductive plating over opposite ends of the package lead.

13. The system as claimed in claim 9 wherein the die attach paddle includes a portion of the die attach paddle exposed from the encapsulation.

14. The system as claimed in claim 13 wherein the encapsulation exposes the second flared shaped region of the die attach paddle.

15. The system as claimed in claim 13 wherein the die attach paddle includes the die attach paddle with an encapsulated lead length greater than twice an exposed lead length.

16. The system as claimed in claim 13 further comprising a conductive plating over opposite ends of the die attach paddle.

* * * * *